(12) United States Patent
Fukuoka (10) Patent No.: US 10,297,488 B2
(45) Date of Patent: May 21, 2019

(54) WORKPIECE SUPPORT JIG

(71) Applicant: DISCO CORPORATION, Tokyo (JP)

(72) Inventor: Takeomi Fukuoka, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/245,977

(22) Filed: Aug. 24, 2016

(65) Prior Publication Data

US 2017/0076971 A1 Mar. 16, 2017

(30) Foreign Application Priority Data

Sep. 10, 2015 (JP) .................................. 2015-178418

(51) Int. Cl.
| | | |
|---|---|---|
| B28D 5/00 | (2006.01) | |
| B28D 5/02 | (2006.01) | |
| H01L 21/683 | (2006.01) | |

(52) U.S. Cl.
CPC ........ H01L 21/6838 (2013.01); B28D 5/0094 (2013.01); B28D 5/023 (2013.01); B28D 5/024 (2013.01); H01L 21/6835 (2013.01); *H01L 2221/68327* (2013.01)

(58) Field of Classification Search
CPC ... H01L 21/304; H01L 21/3043; H01L 21/50; H01L 21/67092; H01L 21/68; H01L 21/683; H01L 21/6838; H01L 21/68778; H01L 21/68354; H01L 21/68327; B28D 5/0094
See application file for complete search history.

(56) References Cited

U.S. PATENT DOCUMENTS

| | | | | |
|---|---|---|---|---|
| 3,809,050 A | * | 5/1974 | Chough ............... | B28D 5/0094 118/35 |
| 3,976,288 A | * | 8/1976 | Cuomo, Jr. ........... | B25B 11/005 269/21 |
| 5,605,489 A | * | 2/1997 | Gale ..................... | B25B 11/005 148/DIG. 28 |
| 5,618,759 A | * | 4/1997 | Boysel ................. | B25B 11/005 438/464 |
| 5,803,797 A | * | 9/1998 | Piper ..................... | B24B 37/30 125/12 |

(Continued)

FOREIGN PATENT DOCUMENTS

| | | |
|---|---|---|
| JP | 2001-024003 | 1/2001 |
| JP | 2001-085449 | 3/2001 |
| JP | 2015-002336 | 1/2015 |

*Primary Examiner* — Tyrone V Hall, Jr.
(74) *Attorney, Agent, or Firm* — Greer Burns & Crain, Ltd.

(57) ABSTRACT

A workpiece support jig includes a support plate supporting a workpiece on a first surface while covering a support surface of a chuck table with a second surface opposite to the first surface and a retainer plate including an area sufficient to cover the whole of the workpiece and sandwiching the workpiece, held on the first surface of the support plate, between the support plate and itself. The support plate includes a plurality of groove parts corresponding to projected division lines of the supported workpiece and a plurality of through holes formed in chip-holding regions demarcated and divided by the intersecting groove parts. When the workpiece divided by a processing unit into chips is unloaded from the chuck table, the workpiece is unloaded while being sandwiched between the support plate and the retainer plate.

4 Claims, 6 Drawing Sheets

(56) References Cited

U.S. PATENT DOCUMENTS

| | | | | |
|---|---|---|---|---|
| 5,809,987 A * | 9/1998 | Wark | ................... | B28D 5/0094 |
| | | | | 125/12 |
| 6,149,727 A * | 11/2000 | Yoshioka | ................ | B05C 11/08 |
| | | | | 118/320 |
| 6,150,240 A * | 11/2000 | Lee | ................... | H01L 21/67092 |
| | | | | 257/E21.238 |
| 6,187,654 B1 * | 2/2001 | Tieber | ................. | B28D 5/0094 |
| | | | | 257/E21.599 |
| 7,446,020 B2 * | 11/2008 | Nakamura | ........ | H01L 21/67092 |
| | | | | 257/E21.215 |

* cited by examiner

WORKPIECE SUPPORT JIG

BACKGROUND OF THE INVENTION

Field of the Invention

The present invention relates to a workpiece support jig for supporting a workpiece when the workpiece is divided into chips.

Description of the Related Art

A wafer such as a semiconductor wafer or an optical device wafer, a ceramic substrate, a resin package, a glass plate, or the like is divided into a plurality of individual chips by using a cutting device or a laser processing device. To maintain good handleability of such a workpiece even after the division into a plurality of chips, the workpiece is usually loaded into the cutting device, laser processing device or the like in the form of a frame unit made by bonding the workpiece at a peripheral part to dicing tape bonded to a ring-shaped frame.

However, the dicing tape used in the frame unit is a factor causing a cost rise since the dicing tape is a disposable member thrown away each time. In certain types of workpieces, no problem arises even if the handling of the chips after the processing is relatively rough. For example, resin substrates and ceramic substrates packaged in chip size package (CSP), ball grid array (BGA) or the like correspond to such types. There has been proposed a cutting device that realizes tapeless processing in the cutting of such workpieces.

SUMMARY OF THE INVENTION

However, in the existing cutting device realizing the tapeless processing, a transfer mechanism for sorting the chips one by one is complex and expensive, and thus there is a problem in that introduction of such a transfer mechanism is difficult in relatively low-cost cutting devices and low-cost devices.

In a tapeless dicer disclosed in Japanese Patent Laid-Open No. 2015-002336, a tapeless cutting device is realized at a low cost by adding a chip-blowing nozzle and a chip case to a manual type cutting device including no transfer mechanism. However, since the chips are stored in the chip case by blowing them off with air, the operator has to take out some chips from the chip case and reload the chips into the chip case. Further, there are some chips not stored in the chip case.

It is therefore the primary object of the present invention to provide a workpiece support jig that realizes processing and loading/unloading of the workpiece without using the dicing tape by employing an extremely simple configuration.

In accordance with an aspect of the present invention, there is provided a workpiece support jig to be used in a processing device equipped with a chuck table for suction-holding a plate-shaped workpiece including a plurality of regions demarcated by a plurality of intersecting projected division lines and processing means for dividing the workpiece held by the chuck table into a plurality of chips along the projected division lines. The workpiece support jig includes: a support plate supporting the workpiece on a first surface while covering a support surface of the chuck table with a second surface opposite to the first surface; and a retainer plate including an area sufficient to cover the whole of the workpiece and sandwiching the workpiece, held on the first surface of the support plate, between the support plate and itself. The support plate includes a plurality of groove parts corresponding to the projected division lines of the supported workpiece and a plurality of through holes formed in chip-holding regions demarcated and divided by the intersecting groove parts. When the workpiece divided by the processing means into chips is unloaded from the chuck table, the workpiece is unloaded while being sandwiched between the support plate and the retainer plate.

Preferably, the workpiece support jig further includes elastic members covering regions for supporting the workpiece on the first surface of the support plate.

According to the present invention, a workpiece support jig realizing the processing and loading/unloading of the workpiece without using the dicing tape by employing an extremely simple configuration is provided.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
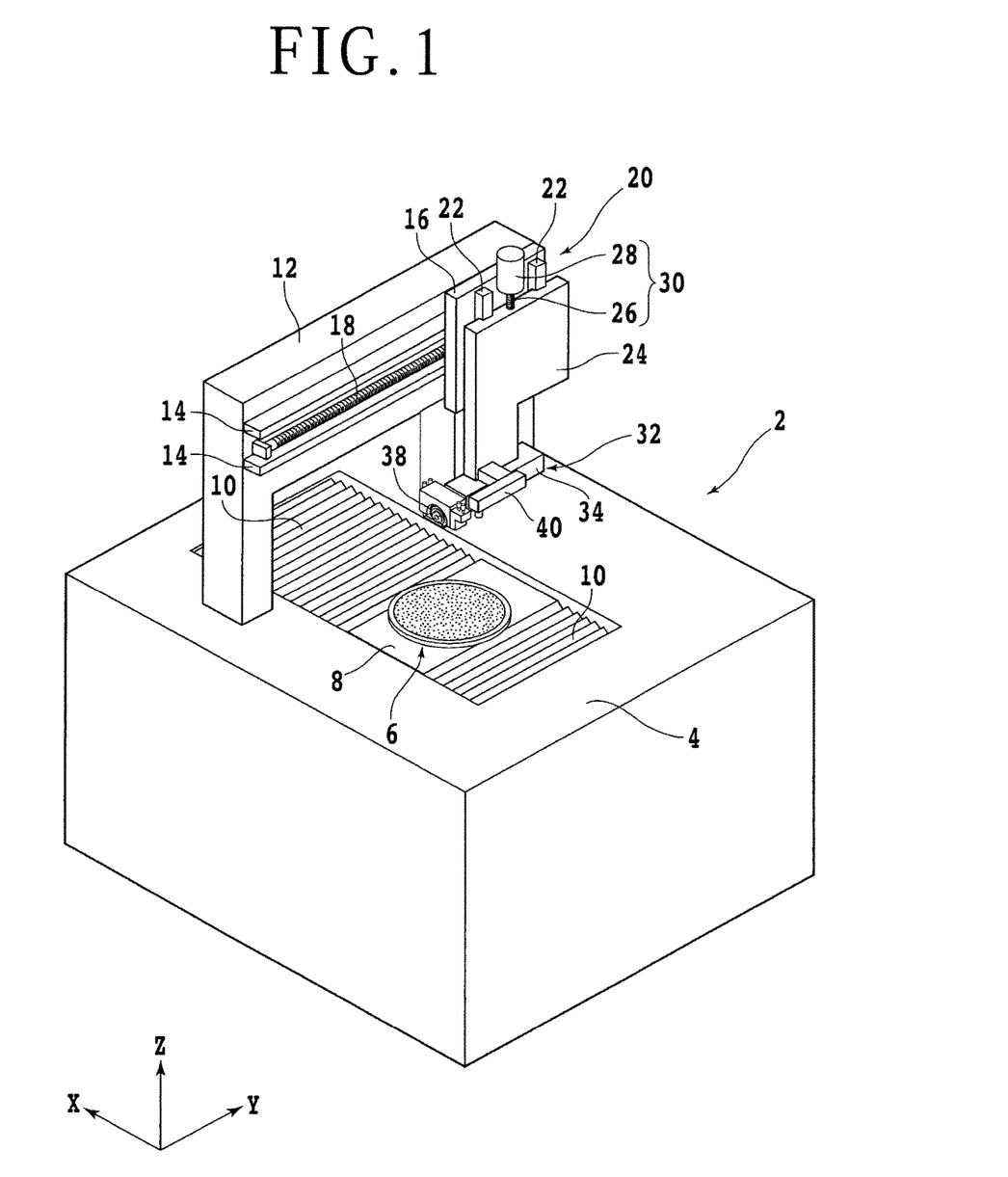
FIG. 1 is a perspective view of a cutting device to which a workpiece support jig according to the present invention is applicable.

Referring now to the drawings, a description will be given in detail of preferred embodiments in accordance with the present invention. FIG. 1 is a perspective view of a cutting device 2 to which a workpiece support jig according to an embodiment of the present invention is applicable. The cutting device 2 depicted in FIG. 1 is a manual type cutting device in which a workpiece is manually set on a chuck table 6 and unloaded from the chuck table 6. The reference number 4 represents the base of the cutting device 2. On the base 4, the chuck table 6 is arranged to be rotatable and to be movable to and fro in an X-axis direction by a processing feed mechanism not depicted. A water cover 8 is arranged around the chuck table 6. A bellows 10 for protecting a shaft part of the processing feed mechanism is connected to the water cover 8 and the base 4.

A gate-shaped column 12 is stood on a rear part of the base 4. A pair of guide rails 14 extending in a Y-axis direction is fixed on the column 12. A Y-axis moving block 16 is mounted on the column 12 to be movable in the Y-axis direction along the guide rails 14 by a Y-axis moving mechanism (indexing feeding mechanism) 20 formed of a ball screw 18 and a pulse motor not depicted.

A pair of guide rails 22 extending in a Z-axis direction is fixed on the Y-axis moving block 16. A Z-axis moving block 24 is mounted on the Y-axis moving block 16 to be movable in the Z-axis direction by a Z-axis moving mechanism 30 formed of a ball screw 26 and a pulse motor 28 while being guided by the guide rails 22.

Figure 4:
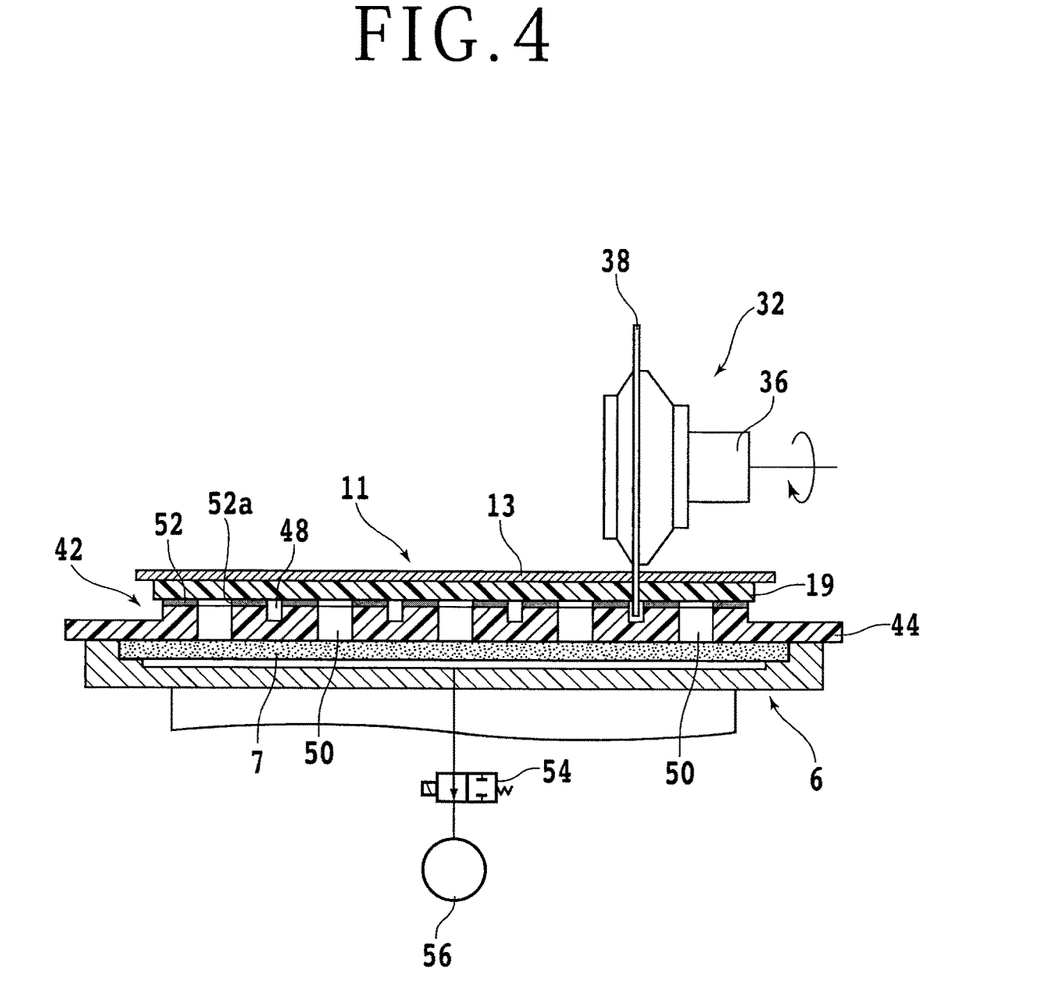
FIG. 4 is a partially sectional side view depicting a state in which the workpiece held by the chuck table via the support jig is cut.

A cutting unit 32 is attached to the Z-axis moving block 24. A spindle 36 depicted in FIG. 4 is rotatably housed in a spindle housing 34 of the cutting unit 32. A cutting blade 38 is attached to a tip end part of the spindle 36 in a detachable manner. The Z-axis moving block 24 is further equipped with an image capturing unit 40 including a microscope and a camera.

Figure 2:
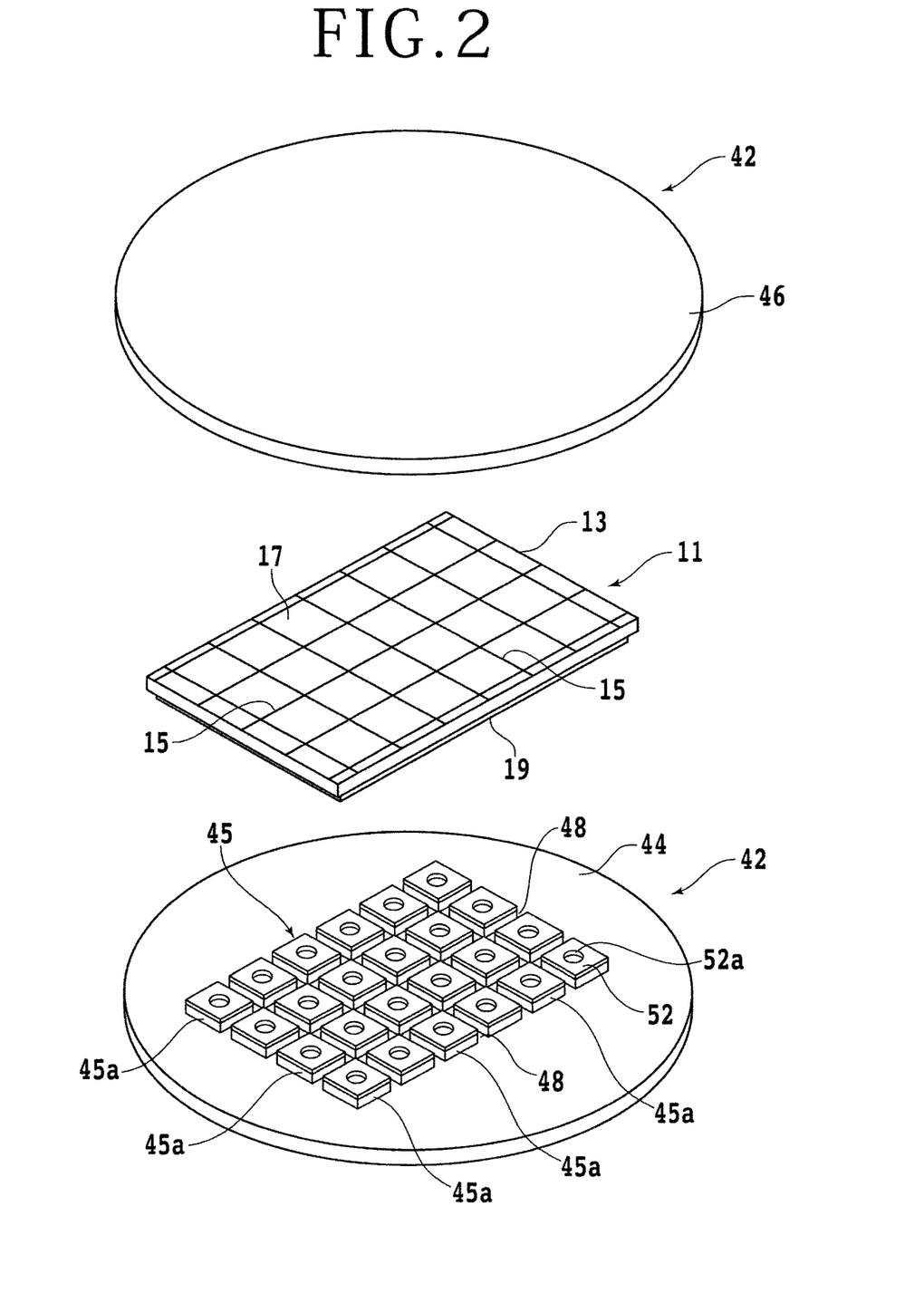
FIG. 2 is a perspective view depicting a state in which a workpiece is sandwiched by a workpiece support jig according to a first embodiment of the present invention.

FIG. 2 is a perspective view depicting how a package substrate 11 as a type of workpiece is supported by a workpiece support jig 42 according to the first embodiment of the present invention. The package substrate 11 includes a resin substrate 13 in a rectangular shape. A device is mounted on a back side of each region 17 demarcated by projected division lines 15 formed in a grid-like pattern. Each device is sealed up with resin 19.

The support jig 42 includes a support plate 44 and a retainer plate 46. The support plate 44 supports the package substrate 11 on a first surface (front side) while covering a support surface 7a (see FIG. 3) of the chuck table 6 with a second surface (back side). The package substrate 11 supported by the support plate 44 is sandwiched between the retainer plate 46 and the support plate 44.

Preferably, both the support plate 44 and the retainer plate 46 are formed with hard resin. Forming the support plate 44 with resin reduces the cost and facilitates the formation and boring of a number of suction parts corresponding to the device chips.

On the front side, the support plate 44 includes a holding part 45 corresponding to the size of the package substrate 11 and being one step higher. On the holding part 45, a plurality of relief grooves 48 for the cutting blade are formed to intersect with each other at right angles. The holding part 45 is divided by the relief grooves 48 into a plurality of holding regions 45a.

Figure 3:
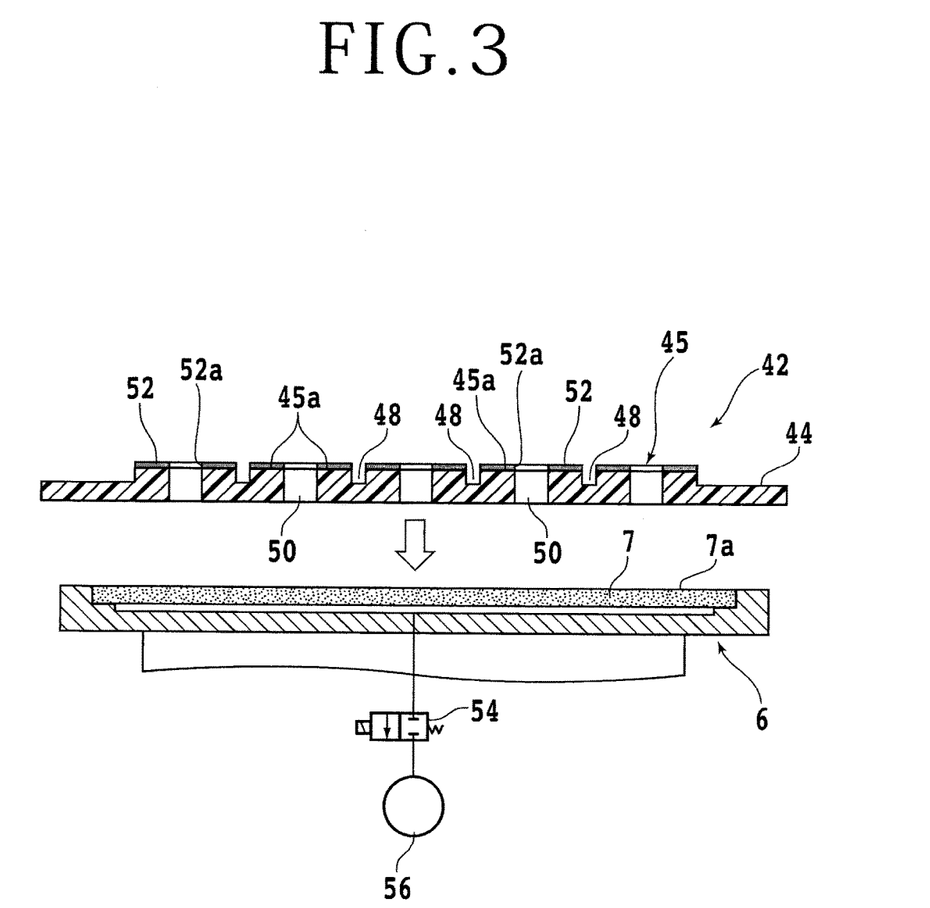
FIG. 3 is a cross-sectional view depicting a state in which a support plate of the support jig is suction-held by a chuck table.
Figure 5A:
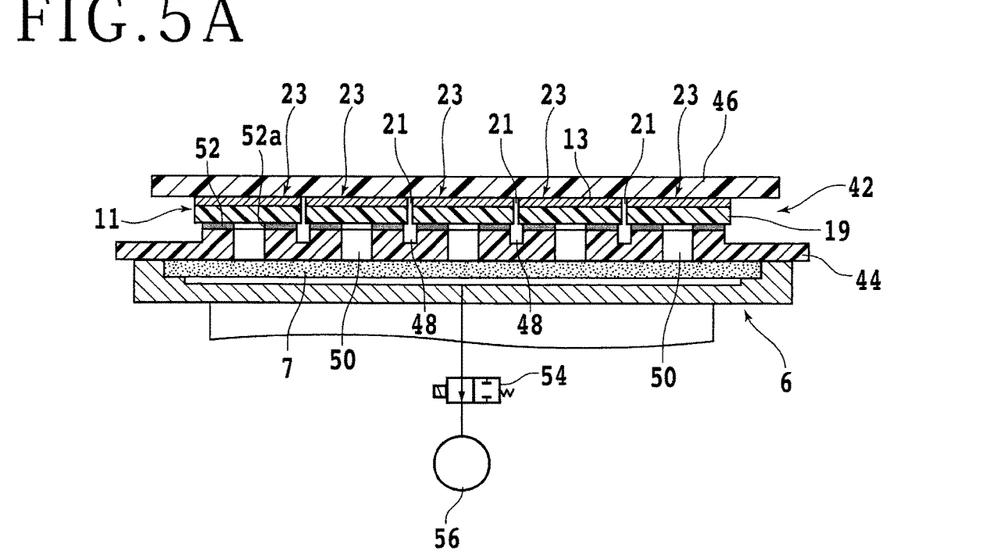
FIG. 5A is a cross-sectional view depicting a state in which a retainer plate is set on the workpiece divided into a plurality of chips.
Figure 5B:
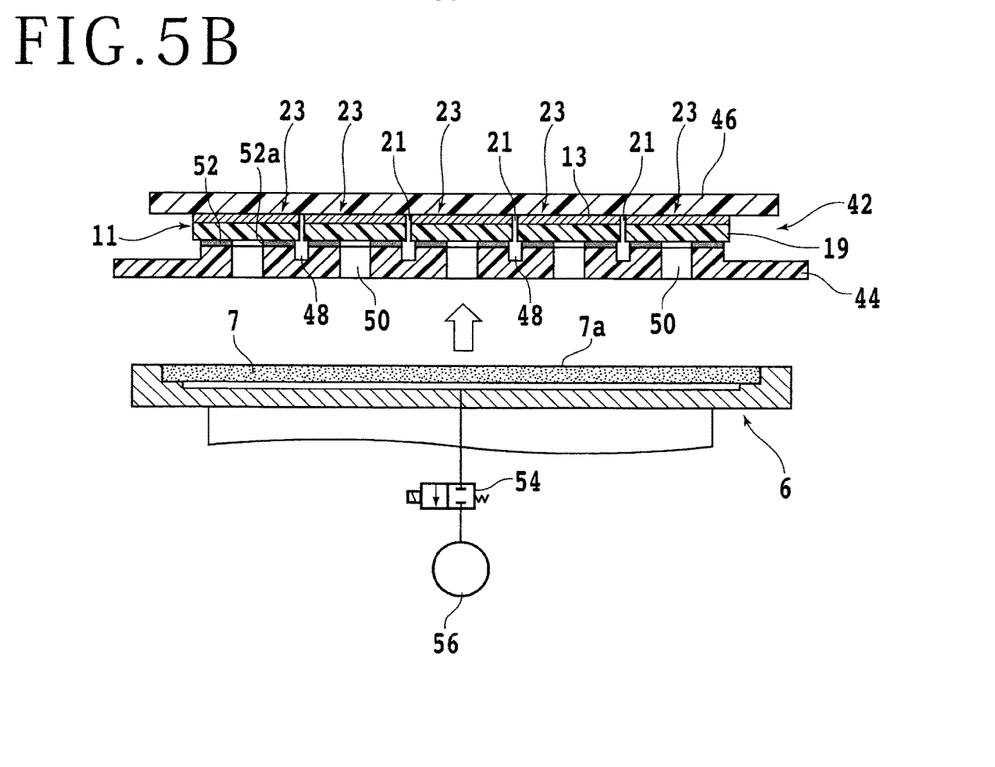
FIG. 5B is a cross-sectional view depicting a state in which the workpiece divided into a plurality of chips is sandwiched by the support plate and the retainer plate of the support jig and unloaded from the chuck table.

As depicted in FIG. 3, a through hole 50 is formed through each holding region 45a. An elastic member 52 made of rubber or the like and including a hole 52a to connect to a corresponding through hole 50 is applied on each holding region 45a. As depicted in FIGS. 5A and 5B, the retainer plate 46 retains the package substrate 11 supported on the support plate 44 from above, and thus the diameter of the retainer plate 46 is set greater than the diagonal length of the package substrate 11.

In the following, a method of using the support jig 42 configured as above will be described. First, as depicted in FIG. 3, the support plate 44 of the support jig 42 is set on the chuck table 6. At this point, communication between a suction source 56 and a suction holder part 7 formed of porous ceramic or the like has been interrupted by positioning a solenoid selector valve 54 at an interruption position.

After setting the support plate 44 on the chuck table 6, the package substrate 11 is set on the holding part 45 of the support plate 44 and the suction holder part 7 is connected to the suction source 56 by switching the solenoid selector valve 54 to a communication position. Accordingly, negative pressure works on the through holes 50 via the suction holder part 7 of the chuck table 6, by which the package substrate 11 is suction-held on the holding part 45 of the support plate 44.

After the package substrate 11 is suction-held by the chuck table 6 via the support plate 44 of the support jig 42, the package substrate 11 is cut as depicted in FIG. 4 by performing the cutting along each projected division line 15 of the package substrate 11 with the cutting blade 38 rotating at high speed while feeding the chuck table 6 in the X-axis direction in FIG. 1. In this case, the tip end of the cutting blade 38 rotates in the blade relief groove 48 formed on the holding part 45 of the support plate 44, and thus the support plate 44 is never damaged by the cutting blade 38.

While index-feeding the cutting unit 32 in the Y-axis direction, the cutting is performed successively along the projected division lines 15 of the package substrate 11, which projected division lines 15 extending in a first direction. Subsequently, the chuck table 6 is rotated by 90 degrees and then the cutting is performed in a similar manner along projected division lines 15 extending in a second direction orthogonal to the first direction, by which the package substrate 11 is divided into a plurality of individual device packages 23 as depicted in FIGS. 5A and 5B.

The state after finishing the division of the package substrate 11 is depicted in FIG. 5A. Subsequently, as depicted in FIG. 5B, the communication between the suction holder part 7 of the chuck table 6 and the suction source 56 is interrupted by switching the solenoid selector valve 54 to the interruption position. Thereafter, in the state in which the package substrate 11 is sandwiched between the support plate 44 and the retainer plate 46 of the support jig 42, the operator unloads the package substrate 11, which has been divided into the individual device packages 23, from the chuck table 6.

With the workpiece support jig 42 according to this embodiment, the package substrate 11 after being divided into the individual device packages 23 can be unloaded in the state of being sandwiched between the support plate 44 and the retainer plate 46. Therefore, the package substrate 11 after the cutting process can be unloaded reliably with an extremely low-cost and simple configuration.

Figure 6:
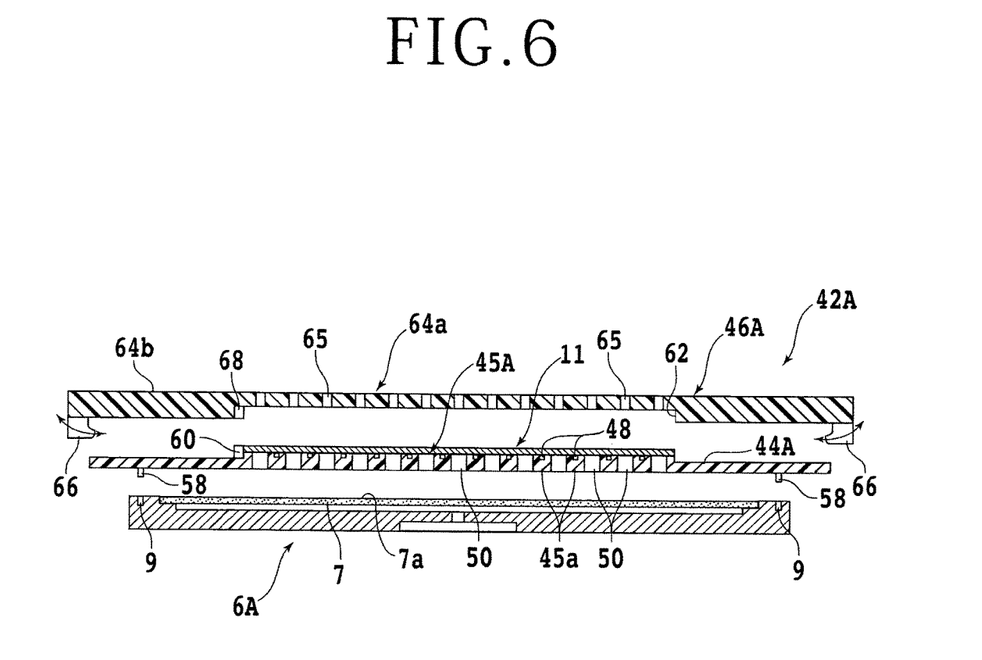
FIG. 6 is a cross-sectional view of a workpiece support jig according to a second embodiment of the present invention.

FIG. 6 is a cross-sectional view of a support jig and a chuck table according to a second embodiment of the present invention. A support plate 44A of the support jig 42A in the second embodiment includes a pair of positioning pins 58 for positioning the support plate 44A with respect to the chuck table 6A. Pin holes 9 for engaging with the positioning pins 58 are formed on the chuck table 6A.

The support plate 44A is further provided with a pair of abutment pins 60 for positioning the package substrate 11 with respect to a holding part 45A of the support plate 44A. The abutment pins 60 are formed along one side or two adjacent sides of the holding part 45A.

A retainer plate 46A includes a rectangular recessed part 62 for housing the holding part 45A of the support plate 44A and the package substrate 11 set on the holding part 45A. Therefore, the retainer plate 46A is formed of a thin-walled part 64a corresponding to the recessed part 62 and a thick-walled part 64b surrounding the thin-walled part 64a.

The retainer plate 46A includes a pair of rotatable latches 66 apart from each other by 180 degrees. A plurality of through holes 65 corresponding to the through holes 50 of the support plate 44A are formed through the thin-walled part 64a of the retainer plate 46A. The retainer plate 46A further includes a housing part 68 for housing the abutment pins 60 of the support plate 44A.

A method of using the support jig 42A of this embodiment configured as above will be described below. First, the support plate 44A of the support jig 42A is positioned and set on the chuck table 6A while fitting the pair of positioning pins 58 into the pin holes 9 of the chuck table 6A. Subsequently, the package substrate 11 is set on the holding part 45A to abut on the abutment pins 60 of the support plate 44A and then the package substrate 11 is suction-held by the holding part 45A of the support plate 44A.

Subsequently, similarly to the state depicted in FIG. 4, the package substrate 11 is divided into a plurality of individual device packages 23 by performing the cutting along the projected division lines 15 of the package substrate 11 with the cutting blade 38 rotating at high speed.

After finishing the division of the package substrate 11, the suction holding of the package substrate 11 is canceled and the latches 66 of the retainer plate 46A are engaged with the support plate 44A. In the state in which the package substrate 11 is sandwiched between the support plate 44A and the retainer plate 46A of the support jig 42A, the operator unloads the package substrate 11, which has been divided into the individual device chips (device packages) 23, from the chuck table 6A.

With the workpiece support jig 42A according to this embodiment, the package substrate 11 can be unloaded from the chuck table 6A in the state in which the latches 66 of the retainer plate 46A have been engaged with the support plate 44A. Therefore, displacement between the support plate 44A and the retainer plate 46A never occurs in the unloading and transportation of the package substrate 11.

Further, since a plurality of through holes 65 are formed through the thin-walled part 64a of the retainer plate 46A, the package substrate 11 divided into the individual device packages 23 can be washed and dried after or during the transportation of the divided package substrate 11 sandwiched by the support jig 42A.

While examples of applying the workpiece support jig 42 or 42A according to an embodiment of the present invention to the package substrate 11 have been described in the above embodiments, the workpiece is not limited to a package substrate. The workpiece support jig according to the present invention is also usable in a similar manner for supporting a ceramic substrate, a raw ceramic substrate, a resin substrate, a glass substrate, and so forth.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A system to be used for processing a plate-shaped workpiece, the system comprising:
    a processing device comprising a chuck table including a suction means for holding the plate-shaped workpiece including a plurality of regions demarcated by a plurality of intersecting projected division lines, a solenoid selector for controlling the suction means, and processing means for dividing the workpiece held by the chuck table into a plurality of chips along the projected division lines;
    a workpiece support jig comprising:
        a support plate supporting the workpiece on a first surface while covering a support surface of the chuck table with a second surface opposite to the first surface; and
        a retainer plate including an area sufficient to cover the whole of the workpiece and sandwiching the workpiece, held on the first surface of the support plate, between the support plate and itself,
    wherein the support plate includes a plurality of groove parts corresponding to the projected division lines of the supported workpiece and a plurality of through holes formed in chip-holding regions demarcated and divided by the intersecting groove parts,
    wherein the through holes extend from the first surface to the second surface, the through holes are configured to receive a suction force from the suction means of the chuck table, and the through holes abut the support surface of the chuck table when the jig is on the chuck table to form a vacuum seal;
    wherein the jig is detachable from the chuck table without disassembly, so that when the workpiece is unloaded from the chuck table, the workpiece is unloaded while being sandwiched between the support plate and the retainer plate; and
    wherein the solenoid selector is configured to interrupt the suction force for removing the jig from the surface of the chuck table, simultaneously breaking the vacuum seal.

2. The system according to claim 1, further comprising elastic members covering regions for supporting the workpiece on the first surface of the support plate.

3. The system according to claim 1, wherein the support plate is formed of resin.

4. The system according to claim 1, wherein the retainer plate includes a pair of rotatable latches, removably securing the retainer plate to the support plate.

* * * * *